United States Patent
Wu et al.

(10) Patent No.: US 7,630,603 B2
(45) Date of Patent: Dec. 8, 2009

(54) OPTICAL WAVEGUIDE RING RESONATOR WITH PHOTO-TUNNELING INPUT/OUTPUT PORT

(75) Inventors: Wei Wu, Mountain View, CA (US); Shih-Yuan Wang, Palo Alto, CA (US); Michael Renne Ty Tan, Menlo Park, CA (US); David A. Fattal, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 17 days.

(21) Appl. No.: 11/829,042

(22) Filed: Jul. 26, 2007

(65) Prior Publication Data
US 2009/0028504 A1 Jan. 29, 2009

(51) Int. Cl.
*G02B 6/26* (2006.01)
(52) U.S. Cl. .................. 385/39; 385/14; 385/31; 385/32
(58) Field of Classification Search .................. None
See application file for complete search history.

(56) References Cited

U.S. PATENT DOCUMENTS

| | | | | |
|---|---|---|---|---|
| 3,456,210 A | * | 7/1969 | Statz et al. ............ | 372/19 |
| 3,538,453 A | * | 11/1970 | Miller ................. | 372/108 |
| 3,801,930 A | * | 4/1974 | Wuerker et al. ........ | 372/19 |
| 4,924,476 A | * | 5/1990 | Behfar-Rad et al. ..... | 372/94 |
| 5,764,681 A | * | 6/1998 | Ballantyne et al. ..... | 372/94 |
| 6,389,197 B1 | | 5/2002 | Iltchenko et al. | |
| 6,665,330 B1 | | 12/2003 | Numai | |
| 6,795,481 B2 | | 9/2004 | Maleki et al. | |
| 6,920,253 B2 | | 7/2005 | Tan et al. | |
| 7,019,847 B1 | | 3/2006 | Bearman et al. | |
| 7,054,009 B2 | | 5/2006 | DePue et al. | |
| 7,072,531 B2 | | 7/2006 | Djordjev et al. | |
| 2006/0182399 A1 | * | 8/2006 | Lin et al. ............ | 385/129 |

FOREIGN PATENT DOCUMENTS

JP 6-29626 A * 2/1994

OTHER PUBLICATIONS

H. Han et al. InGaAs-AlGaAs-GaAs strained-layer quantum-well heterostructure square ring lasers. IEEE Journal of Quantum Electronics, 31:11:1994-1997, Nov. 1995.*

* cited by examiner

*Primary Examiner*—Mike Stahl

(57) ABSTRACT

An optical resonator, a photonic system and a method of optical resonance employ optical waveguide segments connected together with total internal reflection (TIR) mirrors to form a closed loop. The optical resonator includes the optical waveguide segments, the TIR mirrors and a photo-tunneling input/output (I/O) port. The photo-tunneling I/O port includes one of the TIR mirrors. The method includes propagating and reflecting an optical signal, or a portion thereof, in the optical resonator, and transmitting a portion of the optical signal through the photo-tunneling I/O port. The photonic system includes the optical resonator and a source of an optical signal.

18 Claims, 6 Drawing Sheets

OPTICAL WAVEGUIDE RING RESONATOR WITH PHOTO-TUNNELING INPUT/OUTPUT PORT

CROSS-REFERENCE TO RELATED APPLICATIONS

The present invention is related to patent application of Wu et al., entitled "Optical Waveguide Ring Resonator with Optical Gain" Ser. No. 11/829,048, filed concurrently herewith, which is incorporated by reference herein in its entirety.

STATEMENT REGARDING FEDERALLY SPONSORED RESEARCH OR DEVELOPMENT

N/A

BACKGROUND

1. Technical Field

The invention relates to optical waveguides and photonic circuits. In particular, the invention relates to optical waveguide resonators used in photonic systems.

2. Description of Related Art

An optical ring resonator generally comprises a segment or segments of optical waveguide arranged in a ring-shape or essentially a closed loop. Such ring resonators have a variety of important uses in photonic systems. For example, the ring resonator may be part of a photonic filter. In another example, the ring resonator may be employed to one or more of generate, modulate or amplify an optical signal by including an active element or elements along the optical waveguide segment(s) within the ring resonator. A pumped laser may be realized using a ring resonator, for example.

An important characteristic of resonators including, but not limited to, the ring resonator, is optical loss. Optical loss results in a general loss of optical signal energy within the resonator. Loss of the optical signal energy degrades a performance of the resonator and may limit its utility in some applications. A measure of optical loss is a so-called quality factor or 'Q' of the resonator. Good resonators having low loss generally exhibit a high Q and are referred to as 'high-Q resonators' as a result.

In part, optical loss in a ring resonator may be due in part to waveguide loss. Among the sources of waveguide loss are material loss and scattering loss. Material loss occurs when the optical signal is either absorbed or scattered by a material of the optical waveguide. On the other hand, scattering loss is caused by a destructive interaction between the optical signal and a physical boundary of another physical structure of the optical waveguide. Scattering loss generally impedes propagation of the optical signal. Tight coupling between the optical signal and the optical waveguide may further exacerbate such scattering loss. Material loss and scattering loss are generally related to a material make-up and physical type (e.g., cross sectional shape) of the optical waveguide being employed.

Optical loss in a ring resonator may also be associated with or due to the ring-shape of the ring resonator. In particular, ring resonators often experience waveguide loss characterized as leakage loss. In leakage loss, optical loss results when some of the optical signal within the ring resonator escapes or radiates out of the resonator as the optical signal is guided around the closed ring-shaped path of the ring resonator. In particular, the ring-shape generally requires that an optical signal being guided within the resonator must change direction. This change in direction can and does lead to some optical loss, especially when the optical signal is not tightly coupled to the optical waveguide.

Slab optical waveguides such as, but not limited to, ridge-loaded waveguides and inverse ridge-loaded waveguides may exhibit inherently lower scattering loss since the optical signal is loosely coupled to the waveguide. However, such slab optical waveguides may exacerbate the leakage loss especially in ring resonators having one or both of small dimensions and tight turns within the optical waveguide of the ring resonator.

BRIEF SUMMARY

In some embodiments of the present invention, an optical resonator is provided. The optical resonator comprises a plurality of segments of an optical waveguide. The optical resonator further comprises a plurality of total internal reflection (TIR) mirrors. A number of TIR mirrors in the plurality of TIR mirrors is equal to a number of segments in the plurality of segments. The optical resonator further comprises a photo-tunneling input/output (I/O) port. The plurality of segments of the optical waveguide is arranged as a closed loop wherein successive pairs of the segments are connected to one another at respective segment ends by successive ones of the TIR mirrors. The photo-tunneling I/O port comprises a designated TIR mirror of the successive TIR mirrors of the plurality of TIR mirrors.

In other embodiments of the present invention, a photonic system is provided. The photonic system comprises an optical source that produces an optical signal and an optical resonator that receives the optical signal. The optical resonator comprises a plurality of segments of an optical waveguide, a plurality of total internal reflection (TIR) mirrors, and a photo-tunneling input output (I/O) port. A number of TIR mirrors in the plurality of TIR mirrors is equal to a number of segments in the plurality of segments. The plurality of segments of the optical waveguide is arranged as a closed loop. The TIR mirrors connect segment ends of respective successive pairs of the segments of the optical waveguide. The photo-tunneling I/O port comprises a designated TIR mirror of the plurality of TIR mirrors.

In other embodiments of the present invention, a method of optical resonance is provided. The method of optical resonance comprises propagating an optical signal along a plurality of segments of an optical waveguide. The segments of the plurality are arranged as a closed loop forming a ring resonator. Successive pairs of the segments are connected to one another at respective segment ends by successive ones of an equivalent plurality of total internal reflection (TIR) mirrors. The method of optical resonance further comprises reflecting a portion of the optical signal at a TIR mirror of the equivalent plurality. The method further comprises transmitting a portion of the optical signal out of the ring resonator through a photo-tunneling input/output (I/O) port. The photo-tunneling I/O port comprises a designated one of the TIR mirrors of the equivalent plurality.

Certain embodiments of the present invention have other features that are one or both of in addition to and in lieu of the features described hereinabove. These and other features of the invention are detailed below with reference to the following drawings.

BRIEF DESCRIPTION OF THE DRAWINGS

The various features of embodiments of the present invention may be more readily understood with reference to the following detailed description taken in conjunction with the accompanying drawings, where like reference numerals designate like structural elements, and in which.

DETAILED DESCRIPTION

Figure 1A:
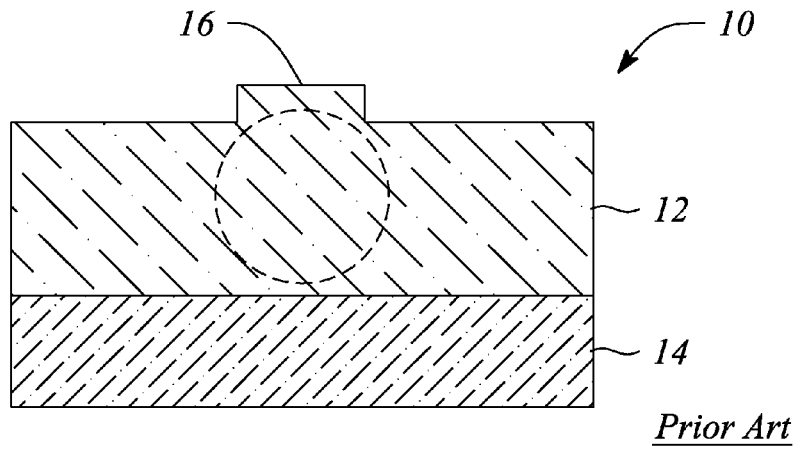
FIG. 1A illustrates a cross sectional view of an exemplary conventional slab optical waveguide known as a ridge-loaded optical waveguide.

Embodiments of the present invention employ optical waveguide segments and total internal reflection (TIR) mirrors to realize an optical resonator having low optical loss. In particular, the optical resonator of the present invention is a closed loop, ring-shaped resonant structure that supports a propagating optical signal within the closed loop. In various embodiments of the optical resonator according to the present invention, one or more input/output ports (I/O ports) are provided. The I/O port(s) facilitate one or both of introducing to and extracting from the optical resonator the propagating optical signal or a portion thereof.

The optical resonator according to various embodiments of the present invention has a relatively compact and space-efficient form factor. Moreover, the optical resonator may be readily fabricated in an integrated form as part of a larger circuit or subsystem. In particular, the optical resonator, according to various embodiments of the present invention, is well-suited to fabrication on or in a substrate such as, but not limited to, a multilayer semiconductor substrate. Fabrication on or in the substrate facilitates integrating the optical resonator with other photonic components including, but not limited to, one or more of passive photonic components and active photonic components.

In some embodiments, the optical resonator may be fabricated directly in a surface layer (e.g., thin film layer) of a semiconductor substrate. For example, the optical resonator may be fabricated in a thin film semiconductor layer of a semiconductor-on-insulator (SOI) substrate (e.g., a silicon or polysilicon thin film layer of a silicon-on-insulator substrate). Other photonic components similarly may be fabricated on or in the same semiconductor substrate and integrated with the optical resonator, according to some embodiments of the present invention. Such photonic components that may be integrated with the optical resonator include, but are not limited to, optical signal transmission structures (e.g., other optical waveguides), optical amplifiers, optical switches, optical modulators, and optical sources (e.g., lasers, light emitting diodes, etc.) and optical detectors.

According to some embodiments, the optical resonator employs a slab optical waveguide. Employing a slab optical waveguide facilitates realizing a resonant structure that exhibits the aforementioned low optical loss. In particular, the propagating optical signal within the optical resonator generally experiences low loss compared to conventional optical resonators, according to some embodiments. In part, the low loss is due to a relatively weak guiding interaction between a guiding structure of the slab optical waveguide and the propagating optical signal. The low loss experienced by the propagating signal in the optical resonator may result in the optical resonator exhibiting a relatively high-Q, according to some embodiments.

In some embodiments, the slab optical waveguide comprises a ridge-loaded optical waveguide. According to other embodiments, the slab optical waveguide comprises an inverted or reverse ridge-loaded optical waveguide. In yet other embodiments, other optical waveguides besides a slab optical waveguide is employed. Such 'non-slab' type optical waveguides may include, but are not limited to, a strip optical waveguide.

As used herein, 'slab optical waveguide' refers to an optical waveguide in which the propagating optical signal is confined to and propagates within a slab or sheet of dielectric material. As such, the slab optical waveguide is a member of the class of dielectric waveguides. The slab optical waveguide is also referred to as simply a 'slab waveguide' herein.

In some embodiments, a thickness of the slab waveguide is selected to preferentially sustain a lower order propagating mode of the optical signal. For example, the thickness may be less than a particular thickness such that only a first transverse electric mode (i.e., $TE_{10}$) can propagate. The particular thickness depends on a refractive index of a material of the slab waveguide as well as specific physical characteristics of the slab waveguide (i.e., optical waveguide type). Design guidelines and equations are readily available for establishing the particular thickness for a given refractive index and optical waveguide type.

FIG. 1A illustrates a cross sectional view of a conventional slab optical waveguide known as a ridge-loaded optical waveguide 10. The ridge-loaded optical waveguide 10 is also sometimes referred to as a 'ridge-loaded waveguide' or simply a 'ridge waveguide'. The ridge-loaded waveguide comprises a slab layer 12. In some embodiments, the slab layer 12 may comprise a thin film layer deposited on an underlying layer or an underlying supporting substrate (not illustrated). In such embodiments, the ridge-loaded waveguide 10 may be termed a 'thin film' ridge-loaded wave guide 10.

The slab layer 12 comprises a dielectric material through which an optical signal propagates and is guided within the ridge-loaded waveguide 10. In particular, essentially all of the energy of the optical signal is confined to the slab layer 12. In general, the slab layer 12 comprises a dielectric material or a semiconductor material, which behaves essentially as a dielectric material with respect to its use in an optical waveguide. Moreover, the material of the slab layer 12 is essentially transparent to the optical signal.

For example, the slab layer 12 may comprise a semiconductor material that is compatible with the optical signal such as, but not limited to, silicon (Si), gallium arsenide (GaAs), and lithium niobate (LiNbO$_3$). Dielectric materials used for the slab layer 12 may include, but are not limited to, glass (e.g., borosilicate glass) and various polymers (e.g., polycarbonate). Any of a single crystalline, polycrystalline or amorphous layer of the dielectric material or the semiconductor material may be employed, according to various embodiments. The transparency of the slab layer material affects an optical loss of the ridge-loaded waveguide. For example, the less transparent the material, the more loss is experienced by the optical signal.

In some embodiments, the slab layer 12 is supported by a support layer 14. The support layer 14 physically supports the slab layer 12. In some embodiments, the support layer 14 also facilitates optical confinement in the slab layer 12. In some embodiments, the support layer 14 may comprise a material that differs from the material of the slab layer 12. In particular, the support layer 14 may comprise a material having a refractive index that is different from a refractive index of the slab layer 12. For example, the support layer 14 may be an oxide-based insulator layer (e.g., silicon oxide). In another example, the support layer 14 is an insulator layer of an SOI substrate. In some embodiments, the different refractive index of the support layer 14 serves to essentially confine the optical signal to the slab layer 12.

The ridge-loaded waveguide 10 further comprises a ridge 16. The ridge 16 is located on and extends above a top surface of the slab layer 12. The ridge 16 serves to 'guide' the optical signal within the slab layer 12. In particular, essentially all of the optical energy of the optical signal is concentrated below but adjacent to the ridge 16 within the slab layer 12. For example, the optical signal may be essentially concentrated in a roughly circular region below the ridge 16, as illustrated by an exemplary dashed circle in FIG. 1A.

The ridge 16 may be formed by one or more of an etching process, a selective deposition process, or a printing process, for example. A particular width and height of the ridge 16 are generally a function of a refractive index of the slab layer 12 material. Information for determining the width and the height may be readily obtained from conventional design guidelines and using computer design models for ridge-loaded optical waveguides.

Figure 1B:
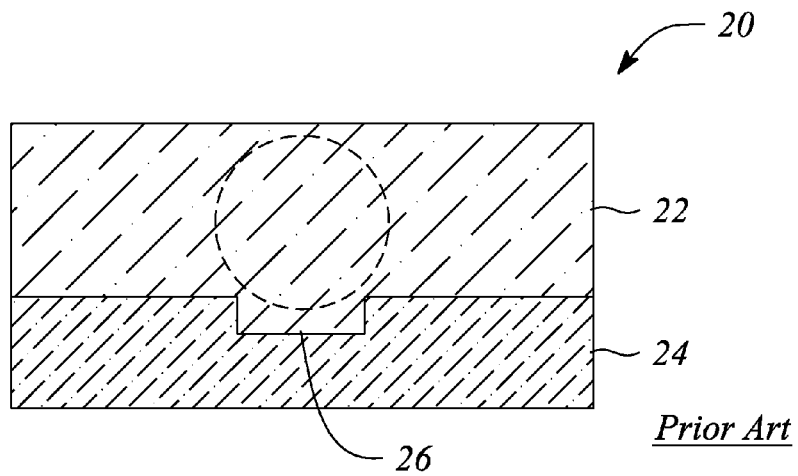
FIG. 1B illustrates a cross sectional view of another exemplary conventional slab optical waveguide known as a reverse ridge-loaded waveguide.

FIG. 1B illustrates a cross sectional view of another conventional slab waveguide known as a reverse ridge-loaded optical waveguide 20. The reverse ridge-loaded optical waveguide 20 is also referred to simply as a 'reverse ridge-loaded waveguide' or a 'reverse ridge waveguide' herein.

The reverse ridge-loaded waveguide 20 comprises a slab layer 22. The reverse ridge-loaded waveguide 20 further comprises a support layer 24. The support layer 24 comprises a material having a refractive index that differs from a refractive index of the slab layer 22. The slab layer 22 is essentially similar to the slab layer 12 of the ridge-loaded waveguide 10 described above, according to some embodiments. Further, the support layer 24 may be essentially similar to the support layer 14 of the ridge-loaded waveguide 10 described above, according to some embodiments. In some embodiments, the slab layer 22 comprises a thin film layer deposited on the support layer 24, wherein the support layer 24 is lying on a supporting substrate (not illustrated). In such embodiments, the reverse ridge-loaded waveguide 20 may be termed a 'thin film' reverse ridge-loaded wave guide 20.

The reverse ridge-loaded waveguide 20 further comprises a ridge 26. The ridge 26 extends from an interface between the support layer 24 and the slab layer 22 down and into the support layer 24. As with the ridge 16 of the ridge-loaded waveguide 10 described above, the ridge 26 of the reverse ridge-loaded waveguide 20 serves to guide the optical signal within the slab layer 22. An exemplary dashed circle above but adjacent to the ridge 26 illustrates an approximate extent of the optical signal energy associated with the optical signal propagating in the reverse ridge-loaded waveguide 20, by way of example.

Figure 1C:
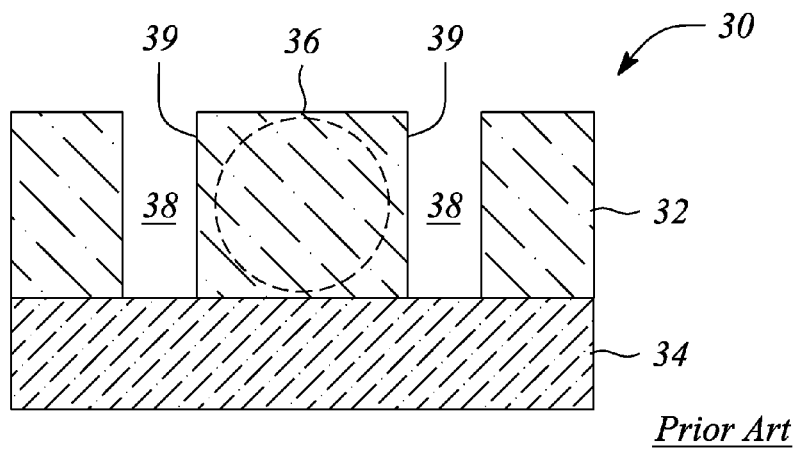
FIG. 1C illustrates a cross sectional view of an exemplary conventional strip optical waveguide.

FIG. 1C illustrates a cross sectional view of an exemplary conventional strip optical waveguide 30. The strip optical waveguide 30, or simply 'strip waveguide', comprises a strip layer 32 and a support layer 34. The strip optical waveguide 30 further comprises a strip 36 formed in or from the strip layer 32. In particular, the strip 36 may be formed in the strip layer 32 by etching channels 38 to define the strip 36, as illustrated in FIG. 1C. The channels 38 optically isolate the strip 36 from the strip layer 32. In other embodiments, the strip 36 comprises the entire strip layer 32 (not illustrated). For example, the strip layer 32 may be essentially removed by etching to leave only the strip 36 during fabrication. As such, channels are not formed.

In contrast to the slab waveguides 10, 20, the optical energy within the strip waveguide 30 is essentially confined to the strip 36 by the presence of sidewalls 39 of the strip 36. A material boundary exists at the sidewalls 39 between a material of the strip layer 32 and air or another dielectric material within the channels 38. The boundary represents a change in a refractive index across the boundary. The refractive index change causes an optical signal to be tightly bound to the strip 36 due to total internal reflection therewithin. A dashed circle within the strip 36 illustrates an approximate extent of the optical energy associated with the optical signal propagating in the strip waveguide 30, for example.

The optical resonator according to various embodiments of the present invention may be referred to as a 'folded cavity' resonator because mirrors are employed along an optical path within the optical resonator. In particular, mirrors are employed to introduce an abrupt change in a direction of the propagating signal within the optical resonator. In other words, an optical path within the resonator is effectively 'folded' by a presence of the mirror. Essentially, the mirrors compensate for weak guiding interaction of the optical waveguides that make up the optical resonator. As such, the mirrors allow the optical resonator to be realized in a more compact and space efficient shape than would be possible otherwise. Total internal reflection mirrors are employed to realize the folded cavity of the optical resonator, according to some embodiments.

A total internal reflection mirror (TIR mirror) is defined as a mirror that reflects or changes a direction of an optical signal using total internal reflection. Total internal reflection is a well-known optical phenomenon. Total internal reflection of an optical signal traveling in a material occurs when the optical signal encounters a material boundary at an angle greater than a critical angle relative to a normal of the boundary. In particular, when the material boundary represents a change in refractive index from a higher refractive index to a lower refractive index, the optical signal will be essentially unable to penetrate the boundary and will be reflected away from the boundary. The reflection obeys the law of reflection in that a reflection angle equals an angle of incidence on the boundary. An example of a boundary that may provide total internal reflection and thus, be employed as a TIR mirror, is a boundary between a dielectric material (e.g., glass or silicon) and air.

The optical resonator according to various embodiments herein employs a photo-tunneling input/output (I/O) port to one or both of introduce optical signals into and extract (i.e., couple) optical signals from the optical resonator. As used herein, a 'photo-tunneling I/O port' is a junction between optical waveguide segments that transmits a propagating signal through a photo-tunneling junction. A photo-tunneling junction is a junction that employs a non-propagating or evanescent optical mode to transmit optical energy across the junction.

For example, a gap or channel may be introduced in an optical waveguide that separates the waveguide into two segments. The gap may comprise an air gap or channel that physically separates the two waveguide segments. The gap, having a different (e.g., lower) refractive index than the refractive index of a material of the waveguide segments, effectively causes a reflection of an optical signal incident on the gap. In particular, the presence of the gap interrupts propagation of the optical signal along the optical waveguide. However, if the gap has an extent that is generally less than, and typically much less than, a wavelength of the optical signal, a non-propagating mode or evanescent field of the optical signal may essentially jump or 'tunnel' across the gap. The tunneling enables the optical signal to propagate from a first segment of the optical waveguide on one side of the gap to a second segment of the optical waveguide on the other side. Moreover, by controlling a width of the gap or a distance between the two optical waveguide segments, an amount of the optical signal that tunnels across the photo-tunneling junction may be controlled or adjusted.

According to some embodiments of the present invention, the photo-tunneling I/O port comprises a TIR mirror, a gap and a segment of an optical waveguide. The gap separates the TIR mirror from an end of the optical waveguide. In other embodiments, the photo-tunneling I/O port comprises a TIR mirror, a gap and another TIR mirror. The gap is generally less than one wavelength of the optical signal incident on the gap. In some embodiments, the gap is approximately one to ten percent (i.e., 1-10%) of the wavelength of the optical signal. Such an arrangement of a TIR mirror, gap and either a segment of optical waveguide or another TIR mirror is also known as a 'frustrated TIR mirror'.

In some embodiments, the optical resonator or a portion thereof may provide asymmetric propagation of the optical signal. In particular, the asymmetric propagation may be relative to a direction of optical signal propagation around a loop of the optical resonator (e.g., clockwise or counter clockwise). In some of such embodiments, asymmetric propagation is provided by a magneto-optical effect.

For example, the optical waveguide of the optical resonator may be selectively doped with a magnetic material. Selective doping may comprise either doping only a portion of one or more of the optical waveguide segments of the optical resonator, doping one or more optical waveguide segments in their entirety, or doping the entire optical resonator, in various embodiments. In another example the magnetic material providing the magneto-optical effect is confined to a layer or layers associated with the optical resonator. For example, a layer comprising magnetic material may be provided underneath and separated from the optical waveguide by less than about a wavelength such that an optical mode propagating in the waveguide couples (e.g., evanescently) into the magnetic material layer. Using a separate layer(s) for the magnetic material may reduce a detrimental effect of the magnetic material, for example. In various embodiments, the magnetic material layer may be either uniformly distributed across the optical resonator or confined to only a portion thereof. For example, the magnetic material layer may be confined to a single waveguide segment of a rectangular-shaped optical resonator.

An externally applied magnetic field may be employed to bias the magnetic material used to dope the optical resonator, according to some embodiments. Magnetic materials comprising one or more of iron (Fe), magnesium (Mg), manganese (Mn), nickel (Ni), cobalt (Co), and various alloys and compounds thereof may be employed. In various embodiments, the use of the magnetic material in conjunction with the optical resonator essentially produces an asymmetric refractive index of the optical waveguide. The asymmetric refractive index essentially provides or facilitates the asymmetric propagation.

For simplicity herein, no distinction is made between a substrate and any layer or structure on the substrate unless such a distinction is necessary for proper understanding. Additionally, all waveguides described herein are optical waveguides so that omission of the term 'optical' when referring to a 'waveguide' does not change the intended meaning of that being described. Further, as used herein, the article 'a' is intended to have its ordinary meaning in the patent arts, namely 'one or more'. For example, 'a segment' means one or more segments and as such, 'the segment' means 'the segments(s)' herein. Also, any reference herein to 'top', 'bottom', 'upper', 'lower', 'up', 'down', 'left' or 'right' is not intended to be a limitation herein. Moreover, examples herein are intended to be illustrative only and are presented for discussion purposes and not by way of limitation. U.S. patent application Ser. No. 11/829,048 of Wu et al., entitled, "Optical Waveguide Ring Resonator with Optical Gain", filed concurrently herewith, is incorporated by reference herein in its entirety.

Figure 2:
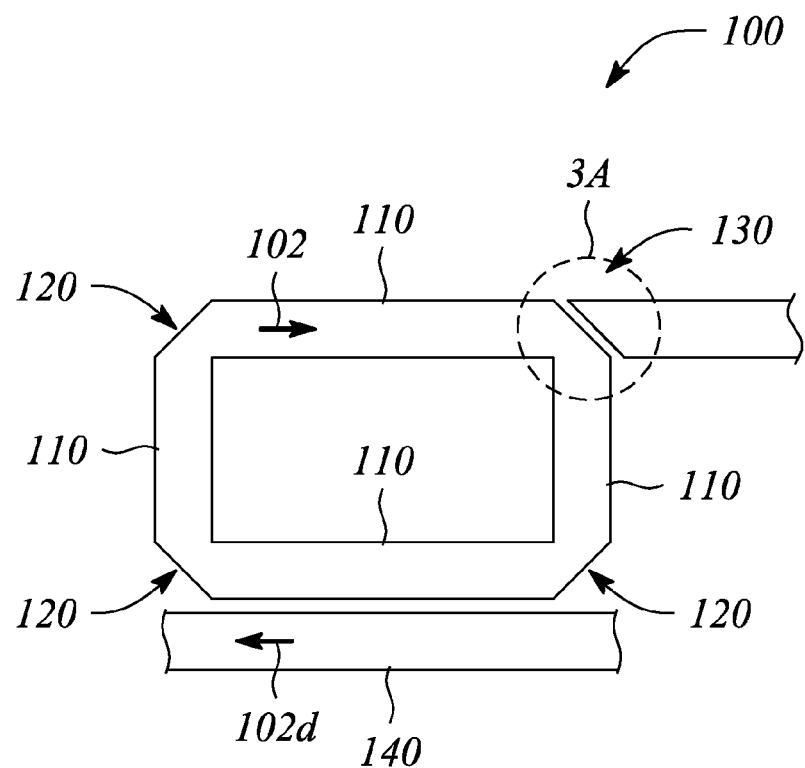
FIG. 2 illustrates a top view of an optical resonator according to an embodiment of the present invention.

FIG. 2 illustrates a top view of an optical resonator 100 according to an embodiment of the present invention. An optical signal 102 is illustrated, by way of example, propagating in a clockwise direction around a closed path of the optical resonator 100. While illustrated as propagating in an exemplary clockwise direction, the optical signal 102 may propagate equally well in a counter clockwise direction and is within the scope of the embodiments described herein.

The optical resonator 100 comprises a plurality of segments 110 of an optical waveguide (i.e., optical waveguide segments 110). The optical waveguide segments 110 are arranged as a closed loop. Each of the optical waveguide segments 110 guides the optical signal 102 along a length of the segment 110. Specifically, the optical signal 102 propagates along each of the segments 110 from an arbitrary starting point and eventually returns to the starting point. As such, when introduced into the optical resonator 100, the optical signal 102 repeatedly retraces or cycles around the closed loop and thus resonates within the optical resonator 100. A resonance frequency of the optical resonator 100 is an inverse of a transit time of the propagating optical signal 102 around to the closed loop.

In some embodiments, the optical waveguide segments 110 of the plurality comprise substantially straight or linear segments of an optical waveguide. The substantially linear optical waveguide segments 110 are arranged as sides of a closed polygon. The polygon is a simple polygon that is either a convex polygon or a concave polygon, according to various embodiments. The optical resonator 100 embodiment illustrated in FIG. 2 comprises four optical waveguide segments 110 that are arranged as four sides of a rectangle representing the closed loop, by way of example. In other embodiments, the closed loop formed by the optical waveguide segments 110 may be represented by essentially any closed polygon having more than two sides including, but not limited to, a triangle, a pentagon, and a hexagon.

The optical resonator 100 further comprises an equivalent plurality of total internal reflection (TIR) mirrors 120. The term 'equivalent plurality' herein is defined to mean that a number or quantity of TIR mirrors 120 in the mirror plurality is equivalent to or the same as a number or quantity of optical waveguide segments 110 in the segment plurality. The TIR mirrors 120 connect pairs of optical waveguide segments 110 to one another to form the closed loop. In particular, each TIR mirror 120 connects together adjacent ends of a respective pair of optical waveguide segments 110 to successively close the loop. Further, the TIR mirrors 120 facilitate propagation of the optical signal 102 within the optical resonator 100. When the optical signal 102 propagating along a particular optical waveguide segment 110 encounters a TIR mirror 120 at the end of the particular segment 110, the TIR mirror 120 redirects or reflects the optical signal 102 such that the optical signal 102 enters an adjacent or successive optical waveguide segment 110.

The optical resonator 100 further comprises a photo-tunneling input/output (I/O) port 130. When functioning as an input port, the photo-tunneling I/O port 130 admits or introduces the optical signal 102, or a portion thereof, into the optical resonator 100. When functioning as an output port, the photo-tunneling I/O port 130 allows the optical signal 102, or a portion thereof, to exit from or leave the optical resonator 100.

In general, whether the photo-tunneling I/O port 130 functions as an input port or an output port depends on a direction of propagation of the optical signal 102. That is, when the optical signal 102 is inside the optical resonator 100 and encounters the photo-tunneling I/O port 130, the port 130 functions as an output port and transmits the optical signal 102, or a portion thereof, out of the optical resonator 100. Alternatively, the photo-tunneling I/O port 130 functions as an input port if the optical signal 102 is incident on the port 130 from outside the optical resonator 100. In either instance, a portion of the optical signal 102 passes through the photo-tunneling I/O port 130 by a photo-tunneling effect (e.g., evanescent field coupling across a gap) associated with the port 130, as described above. In FIG. 2, the photo-tunneling I/O port 130 is illustrated as an output port.

Figure 3A:
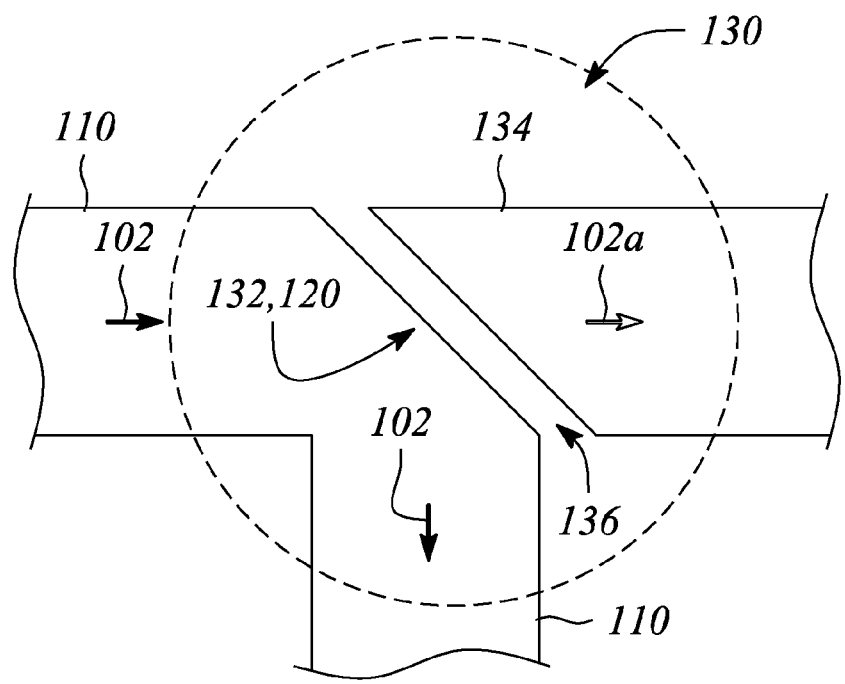
FIG. 3A illustrates a magnified view of a photo-tunneling I/O port portion of the optical resonator illustrated in FIG. 2, according to an embodiment of the present invention.

FIG. 3A illustrates a magnified view of the photo-tunneling I/O port 130 illustrated in FIG. 2, according to an embodiment of the present invention. The photo-tunneling I/O port 130 comprises a designated TIR mirror 132 of the plurality of TIR mirrors 120. The photo-tunneling I/O port 130 further comprises a segment 134 of an optical waveguide having an end. The designated TIR mirror 132 is a selected one of the TIR mirrors 120 adjacent to the end of the segment 134 of optical waveguide. The optical waveguide segment 134 is separate and apart from the plurality of optical waveguide segments 110 of the optical resonator 100. The photo-tunneling I/O port 130 further comprises a gap 136 that separates the end of the optical waveguide segment 134 from the designated TIR mirror 132. Also illustrated in FIG. 3 is a portion 102a of the optical signal 102 that passes through the photo-tunneling I/O port 130 and into the segment 134.

In some embodiments, the gap 136 is filled with a material. In general, the gap material may comprise either a fluid (e.g., a gas or a liquid) or a solid (e.g., a semiconductor material or a dielectric material), in some embodiments. In other embodiments, the gap 136 is essentially devoid of a gap material (e.g., a vacuum). In either case, the gap 136 has a refractive index that differs from and in some embodiments, is lower than a refractive index of respective materials of the designated TIR mirror 132 and the optical waveguide segment 134. For example, the gap material may be a gas (e.g., air) of an environment surrounding the optical resonator 100. Air has a refractive index of about one. The respective materials of the designated TIR mirror 132 and the optical waveguide segment 134 may have refractive indices of about four, for example. Specifically, the refractive indices of the designated TIR mirror 132 material and the optical waveguide segment 134 material is different from the refractive index of the gap material.

In some embodiments, the gap 136 is formed as a slot or channel that separates the designated TIR mirror 132 from the optical waveguide segment 134. In other embodiments, the gap 136 is a region filled with a suitable transmissive material having a refractive index that differs from (i.e., is less than that of) a refractive index of the optical waveguide of the designated TIR mirror 132 and the separate optical waveguide segment 134 (not illustrated).

Figure 3B:
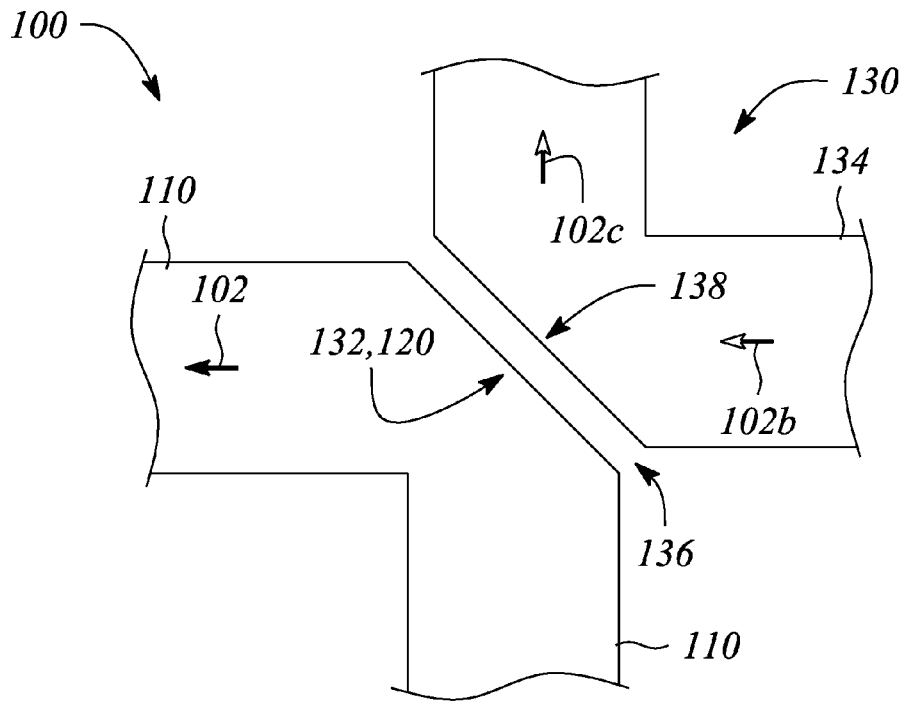
FIG. 3B illustrates a magnified view of a photo-tunneling I/O port portion of the optical resonator illustrated in FIG. 2, according to another embodiment of the present invention.

FIG. 3B illustrates a magnified view of a photo-tunneling I/O port portion of the optical resonator 100, according to another embodiment of the present invention. The photo-tunneling I/O port 130 comprises the designated TIR mirror 132 of the plurality of TIR mirrors 120. The photo-tunneling I/O port 130 further comprises another TIR mirror 138. The other TIR mirror 138 is adjacent to the designated TIR mirror 132 but is not one of the plurality of TIR mirrors 120. In some embodiments, the other TIR mirror 138 may be one of a plurality of TIR mirrors of another optical resonator adjacent to the optical resonator 100. In some of these embodiments, the TIR mirror 138 may connect a pair of optical waveguide segments that are external to the optical resonator 100. For example, one of the pair of segments may be the optical waveguide segment 134 except that the end of the segment 134 comprises the other TIR mirror 138. The photo-tunneling I/O port 130 further comprises the gap 136 that separates the other TIR mirror 138 from the designated TIR mirror 132.

For example, the photo-tunneling I/O port 130 illustrated in FIG. 3B may function as an input port for the optical resonator 100. When the photo-tunneling I/O port 130 of FIG. 3B is functioning as an input port, an optical signal 102b propagating in the optical waveguide segment 134 is partially or completely coupled into the optical resonator 100 through the photo-tunneling I/O port 130 to become the optical signal 102 within the optical resonator 100. A portion of the optical signal 102b at a resonant frequency of the optical resonator 100 may be coupled while portions of the optical signal 102b not at the resonant frequency may not be coupled, for example. When only a portion of the optical signal 102b is coupled into the resonator 100, a remaining portion or portions of the optical signal 102c may continue to propagate along the other optical waveguide segment of the pair after being reflected by the TIR mirror 138. It is within the scope of some embodiments herein for the other optical resonator to be another optical resonator 100 adjacent to the optical resonator 100.

In some embodiments, another optical port may be employed in addition to the photo-tunneling I/O port 130. Referring again to FIG. 2, another optical port is illustrated as a segment 140 of optical waveguide. The segment 140 is parallel and proximal to one of the optical waveguide segments 110 of the optical resonator 100, as illustrated. This sort of other optical port is often referred to as a 'parallel line' port and may function as either an input port or an output port with respect to the optical resonator 100. For example, a portion of an optical signal 102d propagating in the parallel segment 140 of optical waveguide may be coupled into the optical waveguide segment 110. The portion of the optical signal 102d coupled into the optical resonator 100 may become the optical signal 102, for example.

Figure 4:
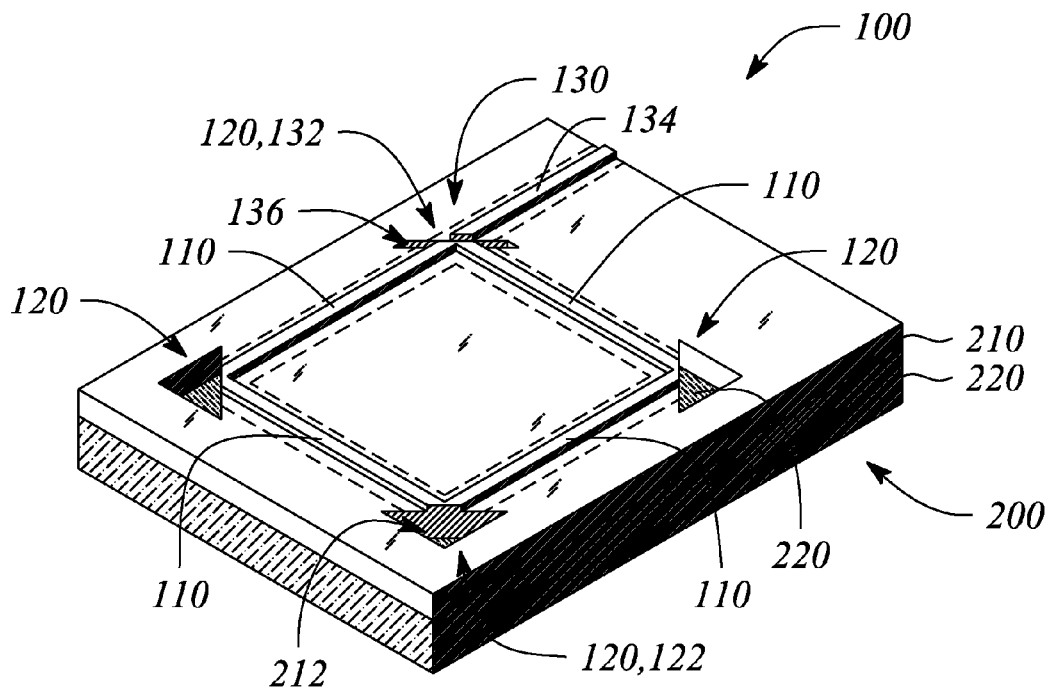
FIG. 4 illustrates a perspective view of the optical resonator of FIG. 2 realized in a surface layer of a substrate, according to an embodiment of the present invention.

FIG. 4 illustrates a perspective view of the optical resonator 100 of FIG. 2 realized in a surface layer of a substrate 200, according to an embodiment of the present invention. In particular, as illustrated in FIG. 4, the substrate 200 comprises a semiconductor on insulator (SOI) substrate 200 having a semiconductor layer 210 situated on top of an oxide-based or similar insulator layer 220. The optical resonator 100 is illustrated within the semiconductor layer 210. The semiconductor layer 210 may be similar to the slab layer 12, 22 described above with respect to FIGS. 1A and 1B, in some embodiments, or the strip layer 32 illustrated in FIG. 1C, in some embodiments. Similarly, the insulator layer 220 may be similar to any of the support layers 14, 24, 34 described above with respect to FIGS. 1A, 1B and 1C, in some embodiments.

Four optical waveguide segments 110 connected by respective ones of four TIR mirrors 120 form the optical resonator 100 embodiment illustrated in FIG. 4, by way of example. Further as illustrated, the optical waveguide segments 110 comprise a ridge-loaded waveguide (e.g., the ridge-loaded optical waveguide 10 described above). An approximate extent of a guided portion of an optical signal is illustrated in FIG. 4 as a pair of dashed lines on either side of a ridge of the ridge-loaded waveguide segments 110.

As illustrated in FIG. 4, the TIR mirrors 120 are each realized by a hole or cavity 212 formed in a guiding portion (i.e., semiconductor layer 210) of the substrate 200. The cavity 212 creates a TIR wall 122 (e.g., refractive index difference or discontinuity) across an optical propagation axis (i.e., a center line of the optical waveguide) of a pair of intersecting optical waveguide segments 110. The TIR wall 122 generally extends beyond the extent of the guided portion of the optical signal. In some embodiments, the TIR wall 122 extends into a ridge portion of the ridge-loaded optical waveguide 110, as illustrated in FIG. 4.

The photo-tunneling I/O port 130 is also illustrated in FIG. 4. The photo-tunneling I/O port 130 is realized by a gap 136 formed in the semiconductor layer 210. The gap 136, having a width of less than one wavelength (e.g., 1-10% of a wavelength) of the optical signal, separates the designated TIR mirror 132 from an optical waveguide segment 134 that acts as an output path or connection for the optical signal. The optical resonator 100 may be fabricated in the SOI substrate 200 using conventional semiconductor fabrication methods, for example.

Figure 5:
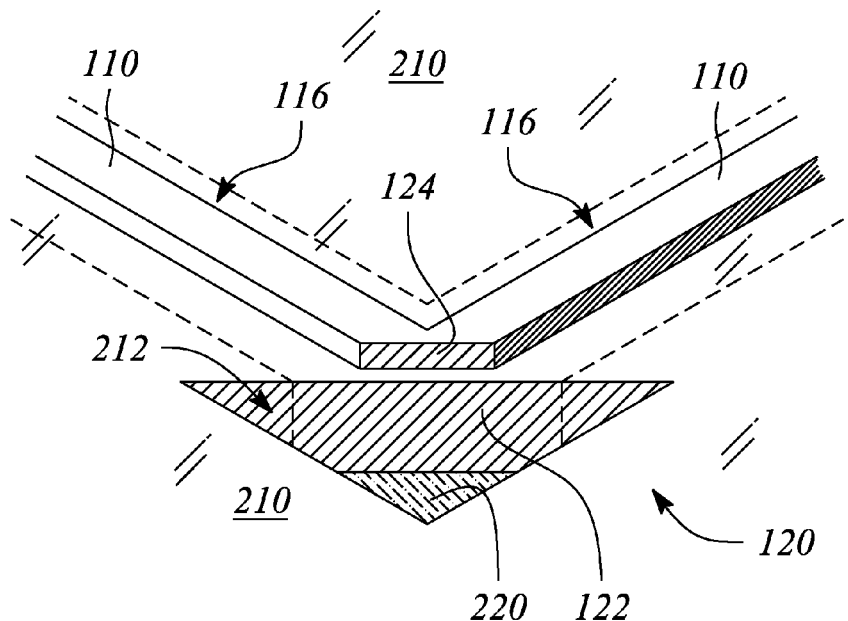
FIG. 5 illustrates a detailed perspective view of an exemplary TIR mirror, according to an embodiment of the present invention.

FIG. 5 illustrates a detailed perspective view of an exemplary TIR mirror 120, according to an embodiment of the present invention. In particular, FIG. 5 illustrates a close-up view of one of the TIR mirrors 120 that connects a pair of adjacent optical waveguide segments 110 at respective segment ends. As illustrated, the TIR mirror 120 comprises a vertically oriented reflecting surface (i.e., the TIR wall 122) formed in the substrate 200 that intersects with two adjacent, intersecting optical waveguide segments 110. Further, as illustrated in FIG. 5, the two optical waveguide segments 110 intersect at about a 90-degree angle relative to one another in some embodiments. As such, the wall 122 intersects each of the intersecting optical waveguide segments 110 at about a 45-degree angle. In other words, the wall 122 creates a 45 degree chamfer across intersecting ends of the two optical waveguide segments 110, in some embodiments. The wall 122 extends beyond a center line (i.e., propagation axis) of each of the optical waveguide segments 110, according to some embodiments. Further, the wall 122 may extend beyond the extent of the guided portion of the optical signal, illustrated by dashed lines, in each of the intersecting optical waveguide segments 110 to insure essentially complete reflection of the optical signal.

The wall 122 is formed by the cavity or hole 212 created in the substrate 200. In some embodiments, the hole 212 extends at least as deep as a thickness of the semiconductor layer 210. The hole 212 may be formed by selectively etching or otherwise removing a portion of the semiconductor layer 210, for example. While illustrated as a triangular hole 212 in FIGS. 4 and 5, the hole 212 may have essentially any shape as long as the wall 122 is formed having a targeted orientation to create the TIR mirror 120.

As illustrated in FIG. 5, the TIR mirror 120 further comprises a ridge wall 124 formed in a ridge 116 of the ridge-loaded optical waveguide. The ridge wall 124 is parallel to the wall 122. In some embodiments, the ridge wall 124 is not employed. In other embodiments, the ridge wall 124 is contiguous and coplanar with the wall 122 (e.g., as illustrated in FIG. 4).

The ridge wall 124 in combination with the wall 122 create the change in refractive index of the TIR mirror 120. Specifically, on one side of the walls 122, 124, the refractive index is that of the semiconductor layer 210 (e.g., refractive index=4.01 for Si). On the other side of the walls 122, 124, the refractive index is approximately the refractive index of 1.0 (i.e., refractive index of air). The change in refractive index satisfies the requirements for total internal reflection to produce the TIR mirror 120.

Figure 6:
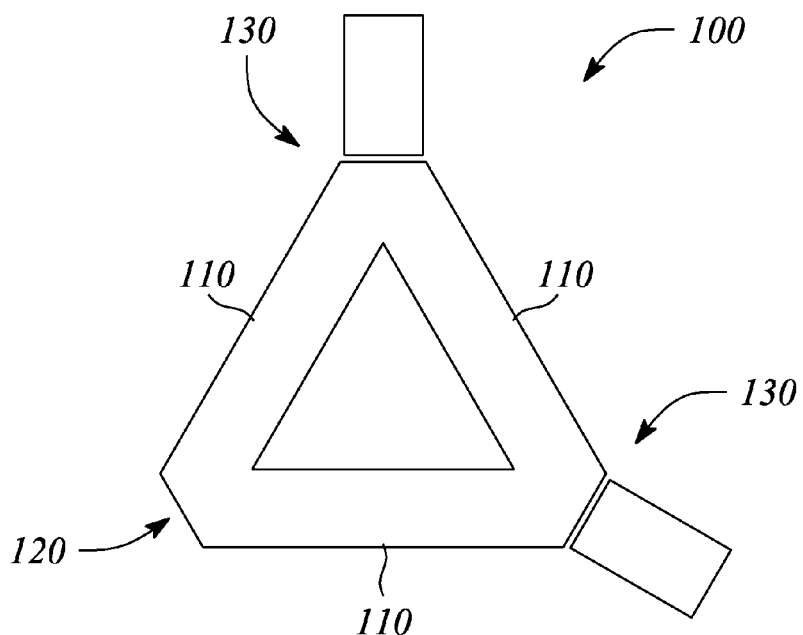
FIG. 6 illustrates a top view of an optical resonator according to another embodiment of the present invention.

As was discussed above, the optical resonator 100 may be realized in the form of essentially any polygon. FIG. 6 illustrates a top view of another embodiment of the optical resonator 100 in a triangular shape, according to an embodiment of the present invention. In particular, three optical waveguide segments 110 are illustrated connected together at respective ends by three TIR mirrors 120. Further, the optical resonator 100 illustrated in FIG. 6 comprises two photo-tunneling I/O ports 130. For example, one of the two photo-tunneling I/O ports may serve as an input port while the other may function as an output port of the optical resonator 100. Each of the two photo-tunneling I/O ports 130 utilizes a different one of the three TIR mirrors 120.

Figure 7:
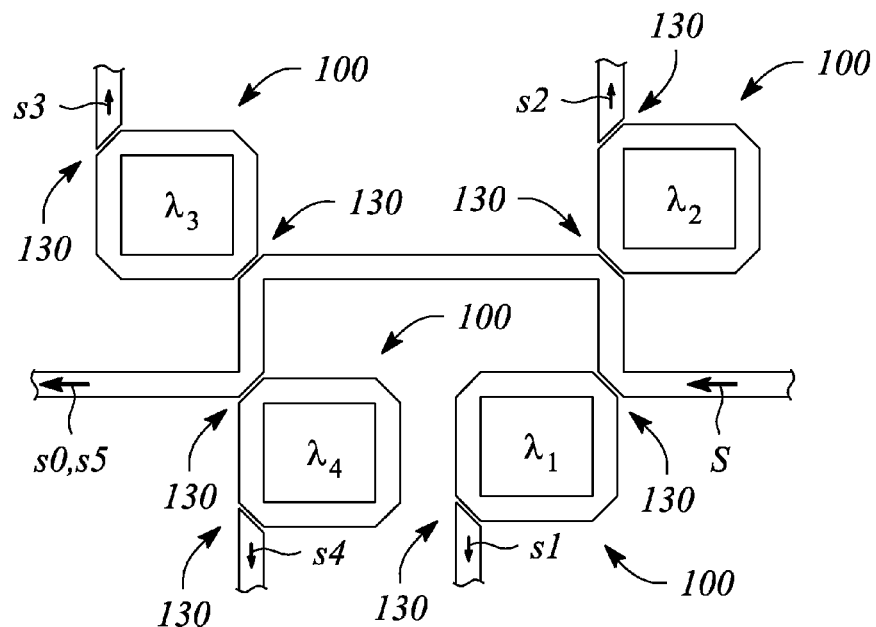
FIG. 7 illustrates a top view of an optical resonator used in an exemplary optical frequency multiplexer, according to an embodiment of the present invention.

FIG. 7 illustrates a top view of the optical resonator 100 used in an exemplary optical multiplexer, according to an embodiment of the present invention. As illustrated, the exemplary optical multiplexer comprises four optical resonators 100. Each of the four optical resonators 100 has a particular resonant frequency or equivalently, a particular resonant optical wavelength $\lambda$ (e.g., $\lambda_1$, $\lambda_2$, $\lambda_3$, and $\lambda_4$). Further as illustrated, each optical resonator 100 comprises two photo-tunneling I/O ports 130. A first photo-tunneling I/O port 130 of the two ports 130 functions as input port and comprises two TIR mirrors. For example, the first photo-tunneling I/O port 130 may be essentially similar to the embodiment described above with respect to FIG. 3B. A second photo-tunneling I/O port 130 of the two ports 130 is an output port and comprises a single TIR mirror. The second photo-tunneling I/O port 130 may be essentially similar to that described above with respect to FIG. 3A, for example.

The optical frequency multiplexer accepts a broadband signal S comprising a plurality of optical frequencies. For example, the broadband signal S may comprise sub-signals s0, s1, s2, s3, s4, s5, s6, each sub-signal having a particular frequency or equivalently, a particular optical wavelength $\lambda$. For example, sub-signal s1 may have the particular optical wavelength $\lambda_1$, sub-signal s2 may have the particular optical wavelength $\lambda_2$, and so on. Due to the particular resonant optical wavelength $\lambda$ of the respective optical resonators 100, specific ones of the sub-signals s0, s1, s2, s3, s4, s5, s6, are selectively and preferentially coupled into each of the four optical resonators 100.

For example, when the broadband signal S encounters a first optical resonator 100 having a resonant wavelength $\lambda_1$, the sub-signal s1 is preferentially coupled into the first optical resonator 100. In some embodiments, the coupling may effectively remove the sub-signal s1 from the broadband signal S leaving only sub-signals s0, s2, s3, s4, s5, s6. The sub-signal s1 may then exit the optical frequency multiplexer at the second photo-tunneling port 130. Similarly, when the input signal S encounters a third optical resonator 100 having a resonant wavelength $\lambda_3$, the sub-signal s3 is preferentially coupled into the third optical resonator 100.

Figure 8:
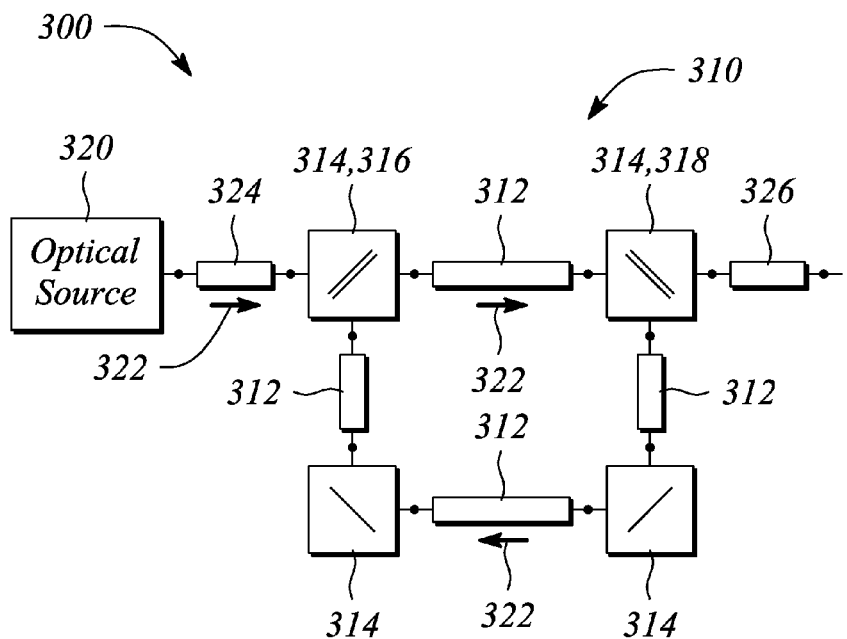
FIG. 8 illustrates a block diagram of a photonic system according to an embodiment of the present invention.

FIG. 8 illustrates a block diagram of a photonic system 300 according to an embodiment of the present invention. The photonic system 300 comprises an optical resonator 310. The optical resonator 310 comprises a plurality of optical waveguide segments 312, an equivalent plurality of TIR mirrors 314 and a photo-tunneling input output (I/O) port 316. The optical waveguide segments 312 are arranged in a closed loop with TIR mirrors 314 interconnecting the segments 312. The photo-tunneling I/O port 316 comprises one of the TIR mirrors 314 of the plurality. In some embodiments, the optical resonator 310 is essentially similar to the optical resonator 100 described above.

The photonic system 300 further comprises an optical signal source 320 that generates an optical signal 322. For example, the optical signal source 320 may comprise a laser or a light emitting diode (LED). The generated optical signal 322 is coupled into and resonates within the optical resonator 310.

In some embodiments, the optical signal 322 is coupled into the optical resonator 310 via the photo-tunneling I/O port 316. For example, the optical signal source 320 may feed the optical signal 322 into a segment of an optical waveguide 324. In turn, the segment of the optical waveguide 324 has an end that terminates in the photo-tunneling I/O port 316. As such, the I/O port 316 functions as an input port in this example.

In other embodiments, the optical signal 322 may be coupled into the optical resonator 310 via another I/O port. For example, a segment of an optical waveguide (not illustrated) parallel with and in close proximity to one of the optical waveguide segments 312 of the optical resonator 310 may act as the I/O port. In some embodiments, either of the photo-tunneling I/O port 316, another photo-tunneling I/O port 318, or another I/O port (not illustrated) may act as an output port.

For example, the output port may sample a portion of the optical signal 322 resonating within the optical resonator 310. The sampled portion is then coupled to an optical waveguide segment 326, for example. As such, the I/O port 318 functions as an output port in this example. In another example, the sampled portion of the optical signal 322 is coupled to another component (not illustrated) external to the optical resonator 310. In some embodiments, the optical source 320 may be located within the optical resonator 310. For example, the optical source 320 may be integrated with one of the optical waveguide segments 312 (not illustrated).

Figure 9:
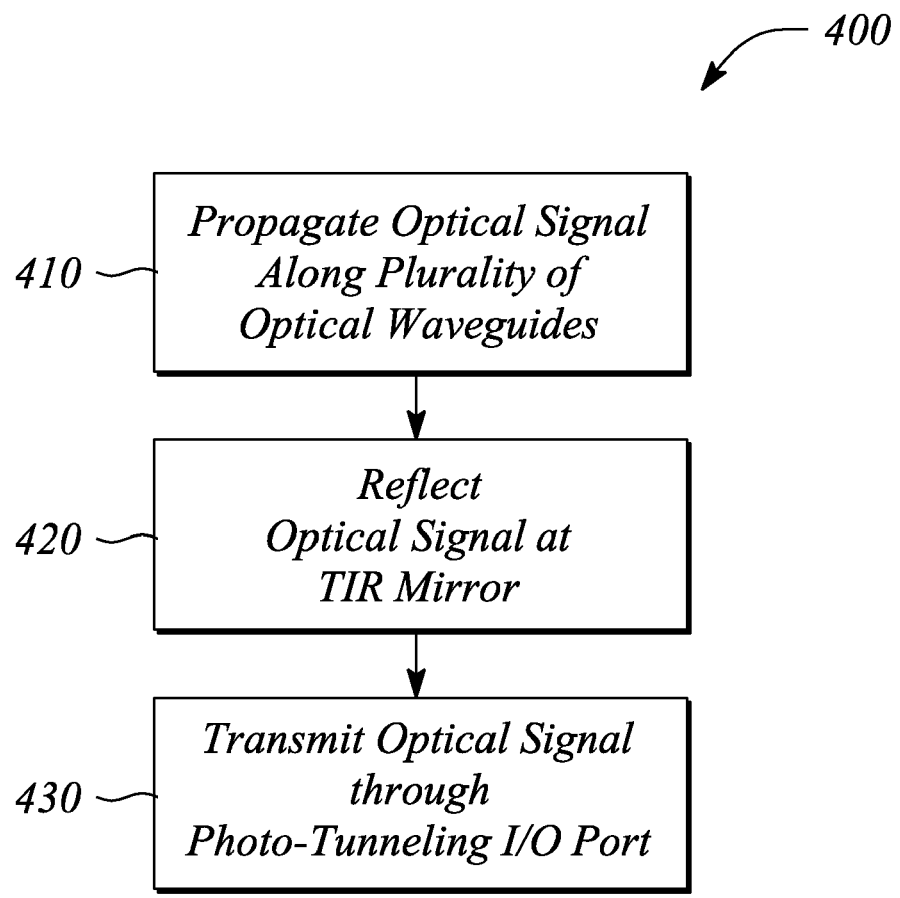
FIG. 9 illustrates a flow chart of a method of optical resonance according to an embodiment of the present invention.

FIG. 9 illustrates a flow chart of a method 400 of optical resonance according to an embodiment of the present invention. The method 400 of optical resonance comprises propagating 410 an optical signal along a plurality of optical waveguide segments. For example, the optical waveguide segments are arranged in a closed loop forming a ring resonator. Successive pairs of the optical waveguide segments are connected to one another at respective adjacent segment ends by corresponding ones of an equivalent plurality of TIR mirrors to further define the closed loop of the ring resonator. In some embodiments, the ring resonator is essentially similar to any of the embodiments described above for the optical resonator 100.

The method 400 of optical resonance further comprises reflecting 420 the optical signal at a TIR mirror. In some embodiments, essentially all of the optical signal is reflected 420 by the TIR mirror. In particular, the optical signal propagating in a first optical waveguide segment of a successive pair is reflected by the TIR mirror connected to the adjacent ends of the first optical waveguide segment and a second optical waveguide segment of the successive pair. After being reflected 420, the optical signal enters and propagates in the second optical waveguide segment of the successive pair. The optical signal ultimately encounters another TIR mirror at an opposite end of the second optical waveguide segment. The other TIR mirror further reflects 420 the optical signal in a similar fashion into a respective successive optical waveguide segment. By successively propagating 410 and reflecting 420, the optical signal may traverse around or circumnavigate the closed loop of the ring resonator. In other embodiments, only a portion of the optical signal is reflected 420.

The method 400 further comprises transmitting 430 the optical signal through a photo-tunneling input/output (I/O) port. Only a portion of the optical signal is transmitted 430 through the photo-tunneling I/O port, according to some embodiments. Transmitting 430 includes within its scope one or both of transmitting out of the ring resonator and transmitting into the ring resonator. In some embodiments, the transmitted 430 optical signal or the portion thereof exits out of or leaves the ring resonator. In transmitting 430 the optical signal out of the ring resonator, the photo-tunneling I/O port is acting as an output port, as defined herein.

The photo-tunneling I/O port comprises a designated one of the TIR mirrors of the ring resonator. The photo-tunneling I/O port further comprises a gap, and according to some embodiments, another optical waveguide segment that is not a part of the plurality of optical waveguide segments. In some embodiments, an end of the other optical waveguide segment comprises another TIR mirror. This other TIR mirror is not a part of the plurality of TIR mirrors. The TIR mirror of the photo-tunneling I/O port generally does not reflect essentially the entire optical signal due to the aforementioned photo-tunneling effect associated with port. Instead, only a portion of the optical signal is reflected 420 by the designated TIR mirror at the photo-tunneling I/O port, while the rest of the optical signal is transmitted 430 out of the ring resonator across the gap and into the optional other optical waveguide segment.

In some embodiments, an optical signal from outside of the ring resonator may be transmitted 430 through the photo-tunneling I/O port and into the ring resonator. Thus, in some embodiments, the photo-tunneling I/O port may act as an input port when the source of the optical signal is outside the ring resonator. In various embodiments, the photo-tunneling I/O port may act either as an input port, an output port, or a combination thereof. In some embodiments, there may be more than one photo-tunneling I/O port, in which case whether or not a particular one of the photo-tunneling I/O ports acts as the output port to transmit 430 the optical signal out of the ring resonator generally depends on a specific configuration of the ring resonator (e.g., location of a source of the optical signal).

In some embodiments, the method 400 further comprises creating the optical signal (not illustrated). For example, an optical signal may be created using an optical source, such as a laser or LED that generates an optical signal. In some embodiments, the method 400 further comprises modifying the optical signal (not illustrated). Modifying the optical signal may comprise one of amplifying the optical signal and modulating the optical signal. In some embodiments, one or more of creating, amplifying and modulating may be performed within at least one of the segments of the plurality of optical waveguide segments.

Thus, there have been described embodiments of an optical resonator, and a method of optical resonance and a photonic system employing the optical resonator. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

What is claimed is:

1. An optical resonator comprising:
 a plurality of segments of a slab optical waveguide, the slab optical waveguide being within a semiconductor layer of a semiconductor on insulator (SOI) substrate, at least one of the segments comprising one or both of a ridge-loaded slab optical waveguide and a reverse ridge-loaded slab optical waveguide;
 a plurality of total internal reflection (TIR) mirrors, a number of TIR mirrors in the plurality of TIR mirrors being equal to a number of segments in the plurality of segments; and
 a photo-tunneling input/output (I/O) port,
 wherein the plurality of segments of the optical waveguide is arranged as a closed loop wherein successive pairs of the segments are connected to one another at respective segment ends by successive ones of the TIR mirrors, and wherein the photo-tunneling I/O port comprises a designated TIR mirror of the successive TIR mirrors of the plurality of TIR mirrors.

2. The optical resonator of claim 1, wherein the semiconductor layer comprises a silicon material that is one or more of single crystalline, polycrystalline, and amorphous.

3. The optical resonator of claim 1, wherein the slab optical waveguide segments comprise the ridge-loaded slab optical waveguide.

4. The optical resonator of claim 1, wherein the slab optical waveguide segments comprise the reverse ridge-loaded slab optical waveguide.

5. The optical resonator of claim 1, wherein the TIR mirrors comprise a refractive index discontinuity that intersects a propagation axis of the slab optical waveguide, the refractive index discontinuity being provided by a gap etched in a surface of the slab optical waveguide.

6. The optical resonator of claim 1, wherein the plurality of segments of a slab optical waveguide comprises linear segments, the segments being arranged as sides of a polygon, and wherein the TIR mirrors are vertices of the polygon.

7. The optical resonator of claim 6, wherein the polygon is one of a rectangle and a triangle.

8. The optical resonator of claim 1, wherein the photo-tunneling I/O port is exclusively an output port for an optical signal propagating in the optical resonator.

9. The optical resonator of claim 1, further comprising another I/O port in addition to the photo-tunneling I/O port.

10. The optical resonator of claim 1, wherein the photo-tunneling I/O port comprises an optical waveguide segment having an end adjacent to and spaced apart from the designated TIR mirror by a gap.

11. The optical resonator of claim 1, wherein the photo-tunneling I/O port comprises another TIR mirror adjacent to and spaced apart from the designated TIR mirror by a gap, the other TIR mirror being in addition to the plurality of the TIR mirrors.

12. The optical resonator of claim 1 used in a system, the system comprising:
 the optical resonator; and
 a source of an optical signal,
 wherein the optical signal from the source one or both of enters and exits the optical resonator through the photo-tunneling I/O port.

13. The optical resonator of claim 1, further comprising a magnetic material, the magnetic material providing asymmetric propagation of an optical signal within the closed loop of the optical resonator through a magneto-optical effect.

14. A photonic system comprising:
 an optical source that produces an optical signal; and
 an optical resonator that receives the optical signal, the optical resonator comprising:
  a plurality of segments of a slab optical waveguide, the segments of the slab optical waveguide being within a semiconductor layer of a semiconductor on insulator (SOI) substrate and comprising one or both of a ridge-loaded slab optical waveguide and an reverse ridge loaded slab optical waveguide;
  a plurality of total internal reflection (TIR) mirrors, a number of TIR mirrors in the plurality of TIR mirrors being equal to a number of segments in the plurality of segments; and
  a photo-tunneling input output (I/O) port,
  wherein the plurality of segments of the slab optical waveguide are arranged as a closed loop, the TIR mirrors connecting segment ends of respective successive pairs of the segments of the slab optical waveguide, and wherein the photo-tunneling I/O port comprises a designated TIR mirror of the plurality of TIR mirrors.

15. The photonic system of claim 14, wherein the optical source is located within a segment of the slab optical waveguide of the optical resonator, the photo-tunneling I/O port being an output port for the optical signal.

16. The photonic system of claim 14, wherein the optical signal is coupled into the optical resonator through one of the photo-tunneling I/O port and another port of the resonator.

17. A method of optical resonance comprising:
 propagating an optical signal along a plurality of segments of a slab optical waveguide within a semiconductor layer of a semiconductor on insulator (SOI) substrate, the segments of the plurality being arranged as a closed loop forming a ring resonator, successive pairs of the segments being connected to one another at respective segment ends by successive ones of an equivalent plurality of total internal reflection (TIR) mirrors;
 reflecting a portion of the optical signal at a TIR mirror of the equivalent plurality; and
 transmitting a portion of the optical signal out of the ring resonator through a photo-tunneling input/output (I/O) port, the photo-tunneling I/O port comprising a designated one of the TIR mirrors of the equivalent plurality, wherein at least one of the segments comprises one or both of a ridge-loaded slab optical waveguide and an reverse ridge loaded slab optical waveguide.

18. The method of optical resonance of claim 17, further comprising one or more of creating the optical signal, amplifying the optical signal and modulating the optical signal, each of which within at least one of the segments of the plurality of slab optical waveguide segments.

* * * * *